(12) United States Patent
Priewasser et al.

(10) Patent No.: US 11,201,126 B2
(45) Date of Patent: Dec. 14, 2021

(54) METHOD OF PRODUCING A SUBSTRATE AND SYSTEM FOR PRODUCING A SUBSTRATE

(71) Applicant: DISCO Corporation, Tokyo (JP)

(72) Inventors: Karl Heinz Priewasser, Munich (DE); Hitoshi Hoshino, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/751,937

(22) Filed: Jan. 24, 2020

(65) Prior Publication Data

US 2020/0251431 A1    Aug. 6, 2020

(30) Foreign Application Priority Data

Feb. 5, 2019    (DE) .................. 10 2019 201 438.0

(51) Int. Cl.
*H01L 23/00*    (2006.01)

(52) U.S. Cl.
CPC .............. *H01L 24/03* (2013.01); *H01L 24/04* (2013.01); *H01L 2224/2919* (2013.01); *H01L 2924/12041* (2013.01); *H01L 2924/13091* (2013.01); *H01L 2924/14* (2013.01)

(58) Field of Classification Search
CPC combination set(s) only.
See application file for complete search history.

(56) References Cited

U.S. PATENT DOCUMENTS

| | | | |
|---|---|---|---|
| 6,071,795 A | 6/2000 | Cheung et al. | |
| 8,541,251 B2* | 9/2013 | Uchiyama | H01L 33/0095 438/33 |
| 9,583,674 B2* | 2/2017 | Minakuchi | H01L 33/007 |
| 10,115,857 B2* | 10/2018 | Okamoto | H01L 21/6835 |
| 2008/0035611 A1 | 2/2008 | Kuno et al. | |
| 2011/0039356 A1* | 2/2011 | Ando | B32B 38/10 438/16 |
| 2011/0062479 A1* | 3/2011 | Sugano | H01L 33/22 257/98 |
| 2011/0163381 A1 | 7/2011 | Yamazaki | |

(Continued)

FOREIGN PATENT DOCUMENTS

CN    107438581 A    12/2017
EP    2228164 A1    9/2010

(Continued)

*Primary Examiner* — Mamadou L Diallo
(74) *Attorney, Agent, or Firm* — Greer Burns & Crain Ltd.

(57) ABSTRACT

The invention relates to a method of producing a substrate with a functional layer. The method comprises providing a workpiece having a first surface and a second surface opposite the first surface, and forming a modified layer inside the workpiece, the modified layer comprising a plurality of modified regions. Further, the method comprises, after forming the modified layer inside the workpiece, forming the functional layer on the first surface of the workpiece and, after forming the functional layer on the first surface of the workpiece, dividing the workpiece along the modified layer, thereby obtaining the substrate with the functional layer. Dividing the workpiece along the modified layer comprises applying an external stimulus to the workpiece. Moreover, the invention relates to a substrate producing system for performing this method.

12 Claims, 7 Drawing Sheets

(56) References Cited

U.S. PATENT DOCUMENTS

| | | | |
|---|---|---|---|
| 2011/0298084 A1* | 12/2011 | Tamemoto | B23K 26/53 |
| | | | 257/507 |
| 2014/0038392 A1 | 2/2014 | Yonehara et al. | |
| 2015/0076662 A1* | 3/2015 | Aida | H01L 21/187 |
| | | | 257/615 |
| 2015/0221816 A1 | 8/2015 | Tajikara et al. | |
| 2016/0254122 A1* | 9/2016 | Wu | H01J 37/3026 |
| | | | 250/492.21 |
| 2016/0336233 A1 | 11/2016 | Yonehara et al. | |
| 2016/0343614 A1* | 11/2016 | Ogawa | B28D 5/022 |
| 2017/0352781 A1* | 12/2017 | Obuchi | H01L 33/0075 |
| 2018/0126484 A1 | 5/2018 | Richter et al. | |
| 2020/0254650 A1* | 8/2020 | Swoboda | B28D 5/0064 |
| 2020/0269357 A1* | 8/2020 | Omori | B23K 26/53 |
| 2020/0365461 A1* | 11/2020 | Manabe | B23K 26/126 |

FOREIGN PATENT DOCUMENTS

| | | |
|---|---|---|
| JP | 2017041482 A | 2/2017 |
| JP | 2017195245 A | 10/2017 |
| KR | 20070031467 A | 3/2007 |
| KR | 20110122857 A | 11/2011 |
| KR | 1020110124112 A | 11/2011 |
| KR | 20140140053 A | 12/2014 |
| KR | 20170086644 A | 7/2017 |
| TW | 201904702 A | 2/2019 |
| WO | 2011108698 A1 | 9/2011 |
| WO | 2012014716 A1 | 2/2012 |
| WO | 2018192689 A1 | 10/2018 |

\* cited by examiner

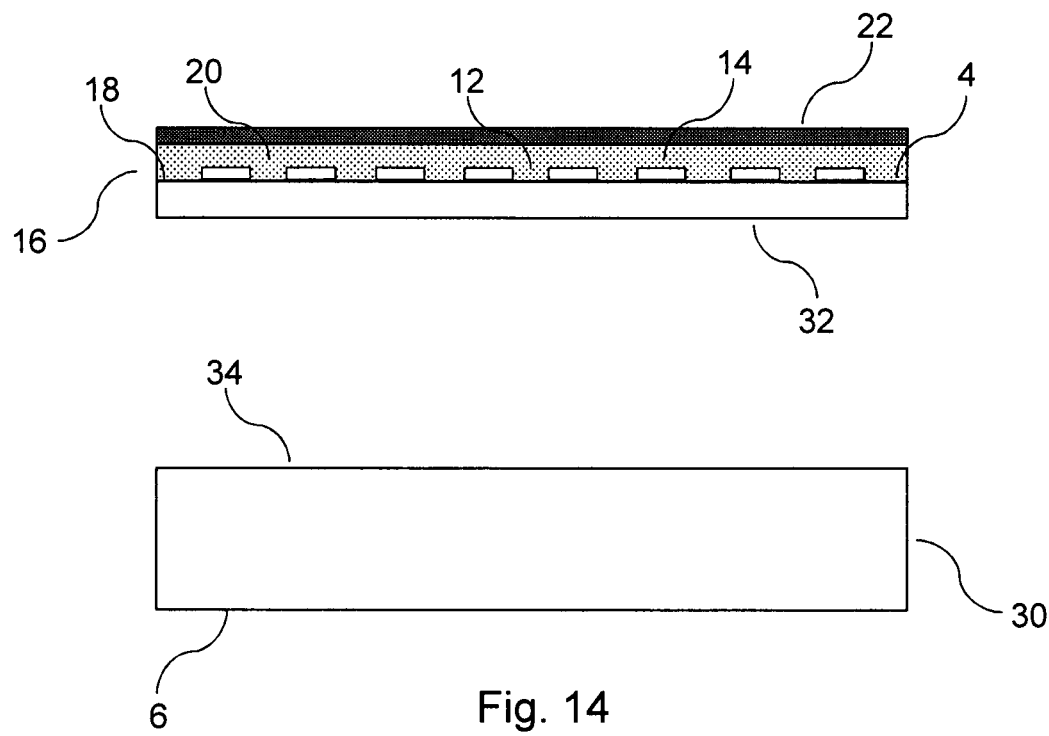
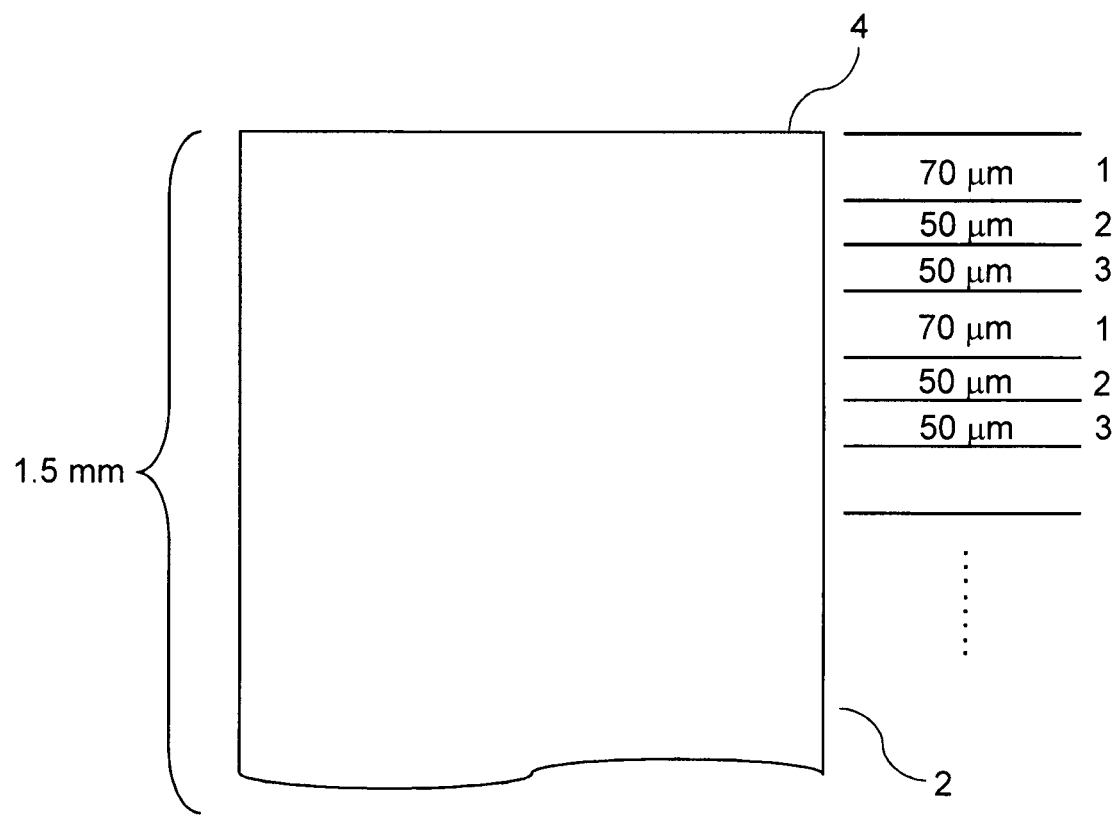
Fig. 14
Fig. 15

METHOD OF PRODUCING A SUBSTRATE AND SYSTEM FOR PRODUCING A SUBSTRATE

TECHNICAL FIELD

The present invention relates to a method of producing a substrate, such as a wafer, with a functional layer, such as a device layer. Further, the present invention relates to a system for performing this method.

TECHNICAL BACKGROUND

On substrates, such as wafers, e.g., semiconductor wafers, devices, such as integrated circuits (ICs), large scale integrations (LSIs) and light emitting diodes (LEDs), are formed by providing a functional layer on a front surface of the substrate. The substrate may be a wafer, for example, made of silicon carbide (SiC), gallium nitride (GaN), silicon (Si) or the like. The devices may be, e.g., semiconductor devices for power semiconductors designed for power saving products.

For example, in an optical device fabrication process, an optical device layer as a functional layer, e.g., composed of an n-type nitride semiconductor layer and a p-type nitride semiconductor layer, is formed on the front side of a single crystal substrate, such as a silicon carbide substrate, a gallium nitride substrate or a sapphire substrate. The optical device layer is partitioned by crossing division lines (also referred to as "streets") to define separate regions where optical devices, such as light emitting diodes and laser diodes, are respectively formed. By providing the optical device layer on the front side of the single crystal substrate, an optical device wafer is formed. The optical device wafer is separated, e.g., cut, along the division lines to divide the separate regions where the optical devices are formed, thereby obtaining the individual optical devices as chips or dies.

The substrate, such as a wafer, on which the functional layer is to be provided is obtained by cutting a workpiece, such as an ingot, prior to forming the functional layer.

Conventionally, the workpiece is cut, for example, by using a wire saw.

However, in the known methods, a significant amount of workpiece material is lost in the process of producing the substrate. For example, if an SiC wafer is obtained by slicing an SiC ingot, e.g., with a wire saw, the wafer thickness is typically about 400 µm. After cutting off the wafer from the ingot, the wafer is ground and/or polished to a thickness of approximately 350 µm. Subsequently, a functional layer, such as a device layer, is formed on a front surface of the wafer. The desired final thickness of the wafer with the functional layer is about 200 µm or less. The problem of workpiece material loss in the substrate producing process is particularly pronounced for expensive workpiece materials, such as SiC.

Hence, there remains a need for an efficient method of producing a substrate and an efficient substrate producing system which allow for the number of substrates to be obtained from a workpiece to be increased.

SUMMARY OF THE INVENTION

Accordingly, it is an object of the present invention to provide an efficient method of producing a substrate which allows for the number of substrates to be obtained from a workpiece to be increased. Further, the invention aims to offer a substrate producing system for performing this method. These goals are achieved by a substrate producing method with the technical features of claim 1 and a substrate producing system with the technical features of claim 12. Preferred embodiments of the invention follow from the dependent claims.

The invention provides a method of producing a substrate with a functional layer. The method comprises providing a workpiece having a first surface and a second surface opposite the first surface and forming a modified layer inside the workpiece. The modified layer comprises a plurality of modified regions. The method further comprises, after forming the modified layer inside the workpiece, forming the functional layer on the first surface of the workpiece, and, after forming the functional layer on the first surface of the workpiece, dividing the workpiece along the modified layer, thereby obtaining the substrate with the functional layer. Dividing the workpiece along the modified layer comprises applying an external stimulus to the workpiece.

In the method of the invention, the modified layer formed inside the workpiece comprises a plurality of modified regions. The modified regions are regions of the workpiece which have been modified, e.g., by the application of an external stimulus, such as radiation, for example, by using a laser beam. The modified regions may be regions of the workpiece in which the structure of the workpiece material has been modified. The modified regions may be regions of the workpiece in which the workpiece has been damaged.

By forming the modified layer, comprising the plurality of modified regions, inside the workpiece, the strength of the workpiece in the areas thereof where the modified regions are formed is reduced. Thus, the strength of the workpiece in the areas where the modified regions are formed is smaller than in those areas thereof in which no modified regions are formed. Hence, the modified layer serves as a separation or division starting layer, facilitating the process of dividing the workpiece.

After forming the functional layer on the first surface of the workpiece, the workpiece is divided along the modified layer, thereby obtaining the substrate with the functional layer. Dividing the workpiece along the modified layer comprises or consists of applying an external stimulus to the workpiece. Thus, no cutting of the workpiece is required to obtain the substrate.

In particular, the functional layer is formed on the first surface of the workpiece after forming the modified layer inside the workpiece. Therefore, the process of forming the modified layer is not affected by the presence of the functional layer, allowing for the modified layer to be formed in a particularly well-defined manner and with a high degree of accuracy. Further, any risk of the functional layer being damaged when forming the modified layer is eliminated.

The arrangement of the modified layer inside the workpiece determines the thickness and the thickness uniformity of the substrate to be obtained from the workpiece. Thus, forming the functional layer on the workpiece after forming the modified layer allows for substrates with a reduced thickness and a high degree of thickness uniformity to be achieved. Hence, the number of substrates which can be obtained from a workpiece is increased while material losses are reduced.

Therefore, the present invention provides an efficient method of producing a substrate which allows for the number of substrates to be obtained from a workpiece to be increased.

The workpiece may be, for example, an ingot, such as a semiconductor ingot, or a substrate, i.e., a thicker substrate from which a thinner substrate is to be obtained, such as a semiconductor substrate. The workpiece, such as an ingot or a thicker substrate, may have a thickness of 1 mm or more or a thickness of 2 mm or more. The thickness of the workpiece is determined in the direction from the first surface towards the second surface of the workpiece.

The first and second surfaces of the workpiece may be substantially parallel to each other.

The workpiece may be, for example, made of a semiconductor, glass, sapphire ($Al_2O_3$), a ceramic, such as an alumina ceramic, quartz, zirconia, PZT (lead zirconate titanate), a polycarbonate, an optical crystal material or the like.

In particular, the workpiece may be, for example, made of silicon carbide (SiC), silicon (Si), gallium arsenide (GaAs), gallium nitride (GaN), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like. Particularly preferably, the workpiece is made of SiC.

The workpiece may be a single crystal workpiece, a glass workpiece, a compound workpiece, such as a compound semiconductor workpiece, e.g., an SiC or GaN workpiece, or a polycrystalline workpiece, such as a ceramic workpiece.

The substrate to be obtained from the workpiece may be made of any of the materials given above. For example, the substrate may be a wafer, such as a semiconductor wafer. The semiconductor wafer may be made of any of the semiconductor materials given above, in particular, SiC.

The functional layer is a layer which provides or exhibits a functionality. This functionality may be, for example, an electrical functionality, such as electrical insulation or conductance, a mechanical functionality, such as mechanical protection, or an electronic functionality, e.g., for the case of a device layer as functional layer.

For example, the functional layer may be a device layer, an epitaxial layer, a GaN layer, a buffer layer, such as a recombination-enhanced buffer layer, a metal layer, a low-k layer or the like. The functional layer may have interconnections, such as bumps, e.g., solder bumps or copper pillar bumps.

In particular, the functional layer may be a device layer. The device layer may comprise devices, such as electronic devices, semiconductor devices, e.g., for power semiconductors, or the like. The devices may comprise or be, for example, transistors, such as MOSFETs, e.g., SiC MOSFETs, or insulated-gate bipolar transistors (IGBTs), or diodes, e.g., Schottky barrier diodes.

The modified layer may be formed inside the workpiece from the side of the first surface of the workpiece. Since the functional layer is formed on the first surface of the workpiece after forming the modified layer inside the workpiece, such a process of forming the modified layer is not affected by the presence of the functional layer. Further, there is no risk of the functional layer being damaged when forming the modified layer.

Forming the modified layer inside the workpiece from the side of the first surface of the workpiece allows for the modified layer to be formed in a particularly well-defined manner and with a particularly high degree of accuracy. This applies, in particular, if the thickness of the substrate to be obtained, e.g., 50 to 200 μm, is considerably smaller than the thickness of the workpiece, e.g., 1 mm or more. For example, the thickness of the substrate to be obtained may be smaller than the thickness of the workpiece by a factor of 3 or more, a factor of 5 or more, a factor of 8 or more, a factor of 10 or more, a factor of 15 or more or a factor of 20 or more. In this case, forming the modified layer inside the workpiece from the side of the first surface of the workpiece requires a significantly smaller penetration depth in the workpiece than forming the modified layer inside the workpiece from the side of the second surface of the workpiece. Hence, the modified layer can be formed particularly accurately, allowing for the thickness of the substrate to be obtained to be further reduced.

Alternatively, the modified layer may be formed inside the workpiece from the side of the second surface of the workpiece. This approach may be adopted, in particular, if the workpiece has a relatively small thickness, e.g., less than 2 mm.

Forming the modified layer inside the workpiece may comprise or consist of applying a laser beam to the workpiece. The workpiece may be made of a material which is transparent to the laser beam. Thus, the laser beam may have a wavelength which allows transmission of the laser beam through the workpiece. The laser beam may be applied to the workpiece at least in a plurality of positions along the first surface. The laser beam may be applied to the workpiece in a condition where a focal point of the laser beam is located at a distance from the first surface in the direction from the first surface towards the second surface. The focal point of the laser beam may be located inside the workpiece.

The modified regions of the modified layer may be regions of the workpiece which have been modified by the application of the laser beam. For example, the modified regions may be regions of the workpiece in which the structure of the workpiece material has been modified by the application of the laser beam. The modified regions may be regions of the workpiece in which the workpiece has been damaged by the application of the laser beam.

The laser beam may be a pulsed laser beam. The pulsed laser beam may have a pulse width, for example, in the range of 1 ns to 300 ns.

Since the functional layer is formed on the first surface of the workpiece after forming the modified layer inside the workpiece, any damage to the functional layer by the application of the laser beam is reliably prevented. Further, the process of applying the laser beam is not affected by the presence of the functional layer, allowing for the modified layer to be formed in a particularly well-defined manner and with a particularly high degree of accuracy.

The laser beam may be applied to the workpiece from the side of the first surface of the workpiece. Since the functional layer is formed on the first surface of the workpiece after forming the modified layer inside the workpiece, the application of the laser beam is not affected by the presence of the functional layer. Further, there is no risk of the functional layer being damaged by the laser beam.

Applying the laser beam to the workpiece from the side of the first surface of the workpiece is particularly advantageous if the thickness of the substrate to be obtained is considerably smaller than the thickness of the workpiece, e.g., by a factor of 3 or more, a factor of 5 or more, a factor of 8 or more, a factor of 10 or more, a factor of 15 or more or a factor of 20 or more. In this case, applying the laser beam from the side of the first surface requires a significantly smaller laser penetration depth in the workpiece than applying the laser beam from the side of the second surface. Hence, the modified layer can be formed particularly accurately, allowing for the thickness of the substrate to be obtained to be further reduced.

Alternatively, the laser beam may be applied to the workpiece from the side of the second surface of the workpiece. This approach may be adopted, in particular, if the workpiece has a relatively small thickness, e.g., less than 2 mm.

The laser beam may be applied to the workpiece at least in a plurality of positions along the first surface in such a manner that adjacent ones of the positions do not overlap each other. The laser beam may be applied to the workpiece at least in a plurality of positions along the first surface in such a manner that a distance between adjacent ones of the positions, i.e., a distance between centres of adjacent positions, is within a range of 3 µm to 50 µm, preferably 5 µm to 40 µm and more preferably 8 µm to 30 µm.

The plurality of modified regions may be formed inside the workpiece so that adjacent or neighbouring modified regions do not overlap each other. In this way, it can be particularly reliably ensured that the workpiece maintains a high degree of strength or robustness for allowing efficient further handling and/or processing thereof. In particular, the possible risk of the workpiece being unintentionally divided during handling thereof can be significantly reduced.

The distance between outer edges of adjacent or neighbouring modified regions may be at least 1 µm.

The laser beam may be applied to the workpiece at least in a plurality of positions along the first surface in such a manner that adjacent ones of the positions at least partially overlap each other.

The plurality of modified regions may be formed in the workpiece so that adjacent or neighbouring modified regions at least partially overlap each other. In this way, the process of dividing the workpiece along the modified layer can be further facilitated.

The modified layer may be formed so as to be substantially parallel to the first surface of the workpiece. In this way, a substrate with a high degree of thickness uniformity can be obtained in a particularly efficient and simple manner.

The modified layer may be formed so as to be closer to the first surface of the workpiece than to the second surface of the workpiece in the thickness direction of the workpiece. For example, the modified layer may be formed so that a distance between the modified layer and the first surface in the thickness direction of the workpiece is smaller than a distance between the modified layer and the second surface in the thickness direction of the workpiece by a factor of 3 or more, a factor of 5 or more, a factor of 8 or more, a factor of 10 or more, a factor of 15 or more or a factor of 20 or more.

The modified layer may be formed so that a distance between the modified layer and the first surface in the thickness direction of the workpiece is larger than the thickness, e.g., the final thickness, of the substrate to be obtained, e.g., by 30 to 100 µm, preferably 40 to 80 µm, more preferably 50 to 70 µm and even more preferably approximately 50 µm. Herein, the term "final thickness" defines the thickness of the substrate after processing of the substrate has been completed or finished, e.g., after all processing steps, such as grinding and/or polishing the substrate, have been carried out. In this way, the loss of workpiece material in the process of obtaining the substrate can be minimised.

The modified layer may be formed substantially over an entire cross-section of the workpiece. The cross-section may be substantially perpendicular to the thickness direction of the workpiece.

The modified layer may be formed so as to be surrounded by a peripheral workpiece portion. The peripheral workpiece portion may surround the modified layer in an extension plane of the modified layer, i.e., a plane in which the modified layer extends. The extension plane of the modified layer may be substantially parallel to the first surface. The peripheral workpiece portion extends along a periphery or circumference of the workpiece. The modified layer may be arranged in a central portion of the workpiece.

In the peripheral workpiece portion, no modified regions may be formed.

Alternatively, modified regions may also be formed in the peripheral workpiece portion. The peripheral workpiece portion may be modified to a lesser degree than the modified layer. For example, in the peripheral workpiece portion, fewer modified regions per unit area of the workpiece may be formed than in the modified layer. In the peripheral workpiece portion, distances between at least some of adjacent or neighbouring modified regions may be larger than in the modified layer. Modified regions formed in the peripheral workpiece portion may be modified to a lesser degree than the modified regions in the modified layer, for example, by applying a different, e.g., weaker, laser beam than for forming the modified layer. Modified regions in the peripheral workpiece portion may be smaller than the modified regions in the modified layer. For example, extensions of the modified regions in the peripheral workpiece portion, e.g., in the thickness direction of the workpiece and/or in directions perpendicular thereto, may be smaller than those of the modified regions in the modified layer.

In the peripheral workpiece portion, areas in which modified regions are formed and areas in which no modified regions are formed may be arranged, e.g., alternatingly arranged, for example, along the circumference of the workpiece. In the peripheral workpiece portion, areas in which modified regions are formed and areas in which no modified regions are formed may be alternatingly arranged along the circumference of the workpiece in such a manner that the areas in which modified regions are formed are, at least substantially, equidistantly spaced from each other in the circumferential direction of the workpiece. Alternatively, the distances in the circumferential direction of the workpiece between adjacent or neighbouring areas in which modified regions are formed may vary along the circumference of the workpiece. Areas in which no modified regions are formed may be, at least substantially, equidistantly spaced from each other in the circumferential direction of the workpiece. Alternatively, the distances in the circumferential direction of the workpiece between adjacent or neighbouring areas in which no modified regions are formed may vary along the circumference of the workpiece. At least some or all of the areas in which modified regions are formed may have the same size, e.g., the same extensions in the thickness direction of the workpiece and/or in directions perpendicular thereto. At least some or all of the areas in which modified regions are formed may differ from each other in size. At least some or all of the areas in which no modified regions are formed may have the same size. At least some or all of the areas in which no modified regions are formed may differ from each other in size. At least some or all of the areas in which modified regions are formed may extend all the way to the peripheral or circumferential edge of the workpiece, e.g., extend in the radial direction of the workpiece all the way from the modified layer to the peripheral or circumferential edge of the workpiece. At least some or all of the areas in which no modified regions are formed may extend all the way to the peripheral or circumferential edge of the workpiece, e.g., extend in the radial direction of the workpiece all the way from the modified layer to the peripheral or circumferential edge of the workpiece.

The size or sizes, e.g., the extensions in the thickness direction of the workpiece and/or in directions perpendicular thereto, of the areas in which modified regions are formed may be equal to or smaller than the size or sizes, e.g., the extensions in the thickness direction of the workpiece and/or in directions perpendicular thereto, of the areas in which no modified regions are formed. The size or sizes, e.g., the extensions in the thickness direction of the workpiece and/or in directions perpendicular thereto, of the areas in which modified regions are formed may be equal to or larger than the size or sizes, e.g., the extensions in the thickness direction of the workpiece and/or in directions perpendicular thereto, of the areas in which no modified regions are formed.

The peripheral workpiece portion may comprise a plurality of, e.g., 2 or more, 3 or more, 5 or more, 8 or more, 10 or more, 12 or more, 15 or more, or 20 or more, areas in which modified regions are formed. The peripheral workpiece portion may comprise a plurality of, e.g., 2 or more, 3 or more, 5 or more, 8 or more, 10 or more, 12 or more, 15 or more, or 20 or more, areas in which no modified regions are formed.

The modified regions in the modified layer and the modified regions in the peripheral workpiece portion, if present, may be formed, at least substantially, at the same distance from the first surface in the direction from the first surface towards the second surface, i.e., may be located, at least substantially, at the same depth inside the workpiece.

The modified regions in the modified layer and the modified regions in the peripheral workpiece portion may be formed, at least substantially, in the same manner. The modified regions in the modified layer may be formed in a manner which is different from the manner in which the modified regions in the peripheral workpiece portion are formed.

By providing such a peripheral workpiece portion with no or less modification of the workpiece, the generation of particles, such as debris, at the periphery of the workpiece, e.g., during the formation of the modified layer, can be significantly reduced or even entirely eliminated. Hence, any contamination of the substrate or processing equipment by such particles can be minimised. Further, it can be reliably ensured that the workpiece maintains a particularly high degree of stability or robustness for allowing efficient further handling and/or processing thereof. In particular, the possible risk of the workpiece being unintentionally divided during handling thereof can be significantly reduced.

The peripheral workpiece portion may have a width in a direction perpendicular to the thickness direction of the workpiece, in particular, in the radial direction of the workpiece, of 0.1 to 2 mm.

The peripheral workpiece portion may have a substantially annular shape. In this case, the peripheral workpiece portion may have a ring width of 0.1 to 2 mm. The ring width is defined as half the difference of the outer diameter of the ring and the inner diameter of the ring.

The peripheral workpiece portion may correspond to a peripheral marginal area of the substrate, such as a wafer, in which no functional layer is to be provided, e.g., in which no devices, in particular, no active devices, are to be formed.

Dividing the workpiece along the modified layer, so as to obtain the substrate with the functional layer, may further comprise separating or dividing the workpiece at the peripheral workpiece portion. In this way, the substrate can be obtained in a particularly efficient and reliable manner.

Separating or dividing the workpiece at the peripheral workpiece portion may comprise or consist of cutting the workpiece at the peripheral workpiece portion. For example, the workpiece may be cut at the peripheral workpiece portion by mechanical cutting, e.g., using a dicer, such as a vertical spindle dicer, a blade, a saw, such as a wire saw, or a cleaving tool, or by laser cutting, e.g., by laser ablation. A cutting tool used for mechanically cutting the workpiece at the peripheral workpiece portion may have a cutting width, e.g., a blade or saw width, of about 30 to 80 μm.

The workpiece may be cut at the peripheral workpiece portion from a peripheral or circumferential side of the workpiece. The cutting direction may be substantially perpendicular to the thickness direction of the workpiece.

The substrate to be obtained from the workpiece is reliably supported by the remainder of the workpiece when separating, e.g., cutting, the workpiece at the peripheral workpiece portion. Thus, any deformation, such as warpage, of the substrate can be prevented. Further, it can be reliably ensured that peripheral edges of the substrate are not damaged. Moreover, due to the presence of the peripheral workpiece portion with no or less modification of the workpiece, no particles are generated in the process of forming the modified layer.

Alternatively or in addition, modified regions may be formed in the peripheral workpiece portion. For example, the modified regions in the peripheral workpiece portion may be formed by applying a laser beam to the workpiece in the manner described above. The laser beam may be applied to the workpiece from the side of the first surface of the workpiece and/or from the side of the second surface of the workpiece and/or from the peripheral or circumferential side of the workpiece.

The modified regions may be formed in the peripheral workpiece portion after forming the modified layer inside the workpiece. The modified regions may be formed in the peripheral workpiece portion after forming the functional layer on the first surface of the workpiece. The modified regions may be formed in the peripheral workpiece portion before applying the external stimulus to the workpiece. Applying the external stimulus to the workpiece may divide the workpiece, or contribute to dividing the workpiece, along the modified layer and along the peripheral workpiece portion.

The method of the invention may further comprise, after dividing the workpiece along the modified layer, grinding and/or polishing a surface of the substrate opposite the first surface where the functional layer is formed. In the grinding and/or polishing process, the substrate may be adjusted to a desired thickness, e.g., the final substrate thickness. In some embodiments, only a grinding process but no polishing process may be performed on the surface of the substrate opposite the first surface.

The method of the invention allows for the modified layer to be formed in a particularly well-defined manner and with a high degree of accuracy, so that substrates with a reduced thickness and a high degree of thickness uniformity can be achieved. Hence, the amount of substrate material to be removed in the grinding and/or polishing process is significantly reduced, thereby minimising material loss.

For example, the thickness of the substrate may be reduced in the grinding and/or polishing process by 30 to 100 μm, preferably 40 to 80 μm, more preferably 50 to 70 μm and even more preferably approximately 50 μm.

The process of polishing the surface of the substrate opposite the first surface may comprise or consist of chemical mechanical polishing (CMP), dry polishing (DP) and/or other types of polishing processes.

After grinding and/or polishing the surface of the substrate opposite the first surface, the surface of the substrate opposite the first surface may be subjected to a metallization process.

The method of the invention may further comprise, after dividing the workpiece along the modified layer, grinding and/or polishing a surface of a remainder of the workpiece, the surface being opposite the second surface of the workpiece. In this way, the remainder of the workpiece can be efficiently prepared for obtaining a further substrate therefrom. In particular, by polishing the surface of the remainder of the workpiece, a smooth surface is achieved. The process of obtaining a further substrate or further substrates from the remainder of the workpiece will be detailed below.

Since the method of the invention allows for the modified layer to be formed in a particularly well-defined manner and with a high degree of accuracy, also the amount of workpiece material to be removed in the process of grinding and/or polishing the remainder of the workpiece is considerably reduced. Thus, also in this regard, material loss is minimised.

For example, the thickness of the remainder of the workpiece may be reduced in the grinding and/or polishing process by 30 to 100 μm, preferably 40 to 80 μm, more preferably 50 to 70 μm and even more preferably approximately 50 μm.

The process of polishing the surface of the remainder of the workpiece may comprise or consist of chemical mechanical polishing (CMP), dry polishing (DP) and/or other types of polishing processes.

After dividing the workpiece along the modified layer, the above-described steps of forming a modified layer, forming a functional layer and dividing the workpiece may be repeated one or more times on a remainder of the workpiece, so as to obtain a plurality of, e.g., two or more, three or more, five or more, eight or more, ten or more, or twelve or more, substrates with functional layers. In this way, plural substrates can be obtained from a single workpiece in an efficient and reliable manner. In particular, the method of the invention allows for the number of substrates to be obtained from the workpiece to be increased, as has been explained in detail above.

Preferably, the above-described steps of forming a modified layer, forming a functional layer and dividing the workpiece are repeated one or more times on the remainder of the workpiece, so as to obtain a plurality of substrates with functional layers, after grinding and/or polishing a surface of the remainder of the workpiece, the surface being opposite the second surface of the workpiece.

The above-described steps of forming a modified layer, forming a functional layer and dividing the workpiece may be repeated on the remainder of the workpiece until a thickness of the remainder of the workpiece reaches a lower limit, e.g., until the remainder of the workpiece becomes too thin to obtain a further substrate therefrom.

The modified regions may comprise amorphous regions and/or regions in which cracks are formed. The modified regions may be amorphous regions or regions in which cracks are formed.

The modified regions may each comprise a space, e.g., a cavity, inside the workpiece material, the space being surrounded by an amorphous region or a region in which cracks are formed.

The modified regions may each be composed of a space, e.g., a cavity, inside the workpiece material and an amorphous region or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the μm range. For example, the cracks may have widths in the range of 5 μm to 100 μm and/or lengths in the range of 100 μm to 1000 μm.

The modified regions may have diameters in the range of 1 μm to 30 μm, preferably 2 μm to 20 μm and more preferably 3 μm to 10 μm.

The method of the invention may further comprise, after forming the functional layer on the first surface of the workpiece, attaching a protective and/or supporting material to the first surface where the functional layer is formed. The protective and/or supporting material may be attached to the first surface before dividing the workpiece along the modified layer.

In particular, in order to protect the functional layer, a protective film or sheet may be applied to the first surface of the workpiece.

The protective film or sheet may be applied to the first surface so that an entire front surface of the protective film or sheet is in direct contact with the first surface. In this case, no material, in particular, no adhesive, is present between the front surface of the protective film or sheet and the first surface. The protective film or sheet may be attached to the first surface by applying an external stimulus to the protective film or sheet during and/or after applying the protective film or sheet to the first surface. Applying the external stimulus to the protective film or sheet may comprise or consist of heating the protective film or sheet and/or cooling the protective film or sheet and/or applying a vacuum to the protective film or sheet and/or irradiating the protective film or sheet with radiation, such as light, e.g., by using a laser beam. The external stimulus may comprise or be a chemical compound and/or electron or plasma irradiation and/or mechanical treatment, such as pressure, friction or ultrasound application, and/or static electricity.

Alternatively or in addition, the protective film or sheet may be provided with an adhesive layer, wherein the adhesive layer is provided only in a peripheral area of the front surface of the protective film or sheet, the peripheral area surrounding a central area of the front surface of the protective film or sheet. In this case, no adhesive is present in the central area of the front surface of the protective film or sheet. In the central area of the front surface of the protective film or sheet, the front surface of the protective film or sheet and the first surface may be in direct contact with each other. The protective film or sheet may be applied to the first surface so that the adhesive layer comes into contact only with a peripheral portion of the first surface. The peripheral portion of the first surface with which the adhesive layer comes into contact may be, for example, a peripheral marginal area of the first surface. In this peripheral marginal area, no functional layer, in particular, no devices, may be present.

The protective film or sheet may be made of a plastic material, such as a polymer. For example, the protective film or sheet may be made of a polyolefin. In particular, the protective film or sheet may be made of polyethylene (PE), polypropylene (PP) or polybutylene (PB).

The protective film or sheet may be heat resistant up to a temperature of 180° C. or more, preferably up to a temperature of 220° C. or more, more preferably up to a temperature of 250° C. or more, and even more preferably up to a temperature of 300° C. or more.

The protective film or sheet may have a thickness in the range of 5 to 200 μm, preferably 8 to 100 μm, more preferably 10 to 80 μm and even more preferably 12 to 50 μm.

A cushioning layer may be attached to a back surface of the protective film or sheet opposite to the front surface thereof. If the cushioning layer is attached to the back surface of the protective film or sheet, protrusions projecting from the first surface along the thickness direction of the workpiece can be embedded in the cushioning layer.

The material of the cushioning layer is not particularly limited. In particular, the cushioning layer may be formed of any type of material which allows for protrusions protruding along the thickness direction of the workpiece to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be heat resistant up to a temperature of 180° C. or more, preferably up to a temperature of 220° C. or more, more preferably up to a temperature of 250° C. or more, and even more preferably up to a temperature of 300° C. or more.

The cushioning layer may have a thickness in the range of 10 to 300 μm, preferably 20 to 250 μm and more preferably 50 to 200 μm.

A base sheet may be attached to the back surface of the cushioning layer opposite to the front surface thereof which is attached to the protective film or sheet.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 μm, preferably 40 to 1200 μm and more preferably 50 to 1000 μm.

A front surface of the base sheet may be in contact with the back surface of the cushioning layer, and a back surface of the base sheet opposite to the front surface thereof may be substantially parallel to the first surface of the workpiece and/or to the modified layer formed inside the workpiece. Thus, when processing, e.g., grinding and/or polishing, the surface of the substrate opposite the first surface, a suitable counter pressure can be applied to the back surface of the base sheet, e.g., by placing this back surface on a chuck table.

The protective film or sheet, optionally including the cushioning layer or the cushioning layer and the back sheet, may be removed from the first surface after dividing the workpiece along the modified layer. The protective film or sheet, optionally including the cushioning layer or the cushioning layer and the back sheet, may be removed from the first surface after grinding and/or polishing the surface of the substrate opposite the first surface. The protective film or sheet, optionally including the cushioning layer or the cushioning layer and the back sheet, may be removed from the first surface after the surface of the substrate opposite the first surface has been subjected to a metallization process.

Alternatively, the protective and/or supporting material to be attached to the first surface of the workpiece may be, for example, a film, a sheet, a tape or a plate, such as a glass plate, with an adhesive applied to an entire surface thereof which comes into contact with the first surface.

Applying the external stimulus to the workpiece may comprise or consist of applying an ultrasonic wave to the workpiece and/or applying pressure to the workpiece and/or applying a mechanical force to the workpiece and/or heating the workpiece and/or cooling the workpiece and/or applying a vacuum to the workpiece. Particularly preferably, applying the external stimulus to the workpiece comprises or consists of applying an ultrasonic wave to the workpiece.

By applying the external stimulus to the workpiece, the workpiece is separated in the area where the modified layer is formed. In this area, the strength of the workpiece is reduced due to the presence of the modified regions, thus facilitating separation of the workpiece by the application of the external stimulus.

If the modified layer is formed substantially over an entire cross-section of the workpiece, the workpiece may be fully divided along the modified layer by applying the external stimulus, thereby obtaining the substrate with the functional layer.

If the peripheral workpiece portion with no or less modification of the workpiece is provided, dividing the workpiece, so as to obtain the substrate with the functional layer, may further comprise separating or dividing the workpiece at the peripheral workpiece portion.

The invention further provides a system for producing a substrate with a functional layer. The system comprises a support member for supporting a workpiece, the workpiece having a first surface and a second surface opposite the first surface, and a modified layer forming means configured to form a modified layer inside the workpiece, the modified layer comprising a plurality of modified regions. Further, the system comprises a functional layer forming means configured to form the functional layer on the first surface of the workpiece, after forming the modified layer inside the workpiece, and a dividing means configured to divide the workpiece along the modified layer, thereby obtaining the substrate with the functional layer, after forming the functional layer on the first surface of the workpiece. The dividing means comprises or consists of an external stimulus applying means configured to apply an external stimulus to the workpiece.

The substrate producing system of the invention is a system configured for performing the substrate producing method of the invention. The substrate producing system thus provides the technical effects and advantages already described in detail above for the substrate producing method.

The features described above for the substrate producing method of the invention also apply to the substrate producing system of the invention.

The workpiece, the substrate, the functional layer, the modified layer and the modified regions may be the same as described above.

The substrate producing system may comprise a control for controlling the components of the system. The control may comprise a plurality of control units, e.g., control units for controlling different components of the system.

The control may be configured to control the substrate producing system so as to perform the substrate producing method of the invention.

The control may be configured to control the modified layer forming means so as to form the modified layer inside the workpiece. The control may be configured to control the functional layer forming means so as to form the functional layer on the first surface of the workpiece, after forming the modified layer inside the workpiece. The control may be configured to control the dividing means so as to divide the workpiece along the modified layer, thereby obtaining the substrate with the functional layer, after forming the functional layer on the first surface of the workpiece. The control may be configured to control the external stimulus applying means so as to apply the external stimulus to the workpiece.

The support member may comprise or be, for example, a chuck table or the like.

The modified layer forming means may be configured to form the modified layer inside the workpiece from the side of the first surface of the workpiece. The modified layer forming means may be configured to form the modified layer inside the workpiece from the side of the second surface of the workpiece.

The modified layer forming means may comprise or consist of a laser beam applying means configured to apply a laser beam to the workpiece, in particular, the workpiece supported by the support member. Forming the modified layer inside the workpiece may comprise or consist of applying the laser beam to the workpiece. The laser beam applied to the workpiece by the laser beam applying means may have a wavelength that allows transmission of the laser beam through the workpiece. The laser beam applying means may be configured to apply the laser beam to the workpiece at least in a plurality of positions along the first surface. The laser beam applying means may be configured to apply the laser beam to the workpiece in a condition where a focal point of the laser beam is located at a distance from the first surface in the direction from the first surface towards the second surface. The laser beam applying means may be configured to apply the laser beam to the workpiece in a condition where the focal point of the laser beam is located inside the workpiece.

The laser beam applying means may be configured to apply a pulsed laser beam to the workpiece. The pulsed laser beam may have a pulse width, for example, in the range of 1 ns to 300 ns.

The laser beam applying means may be configured to apply the laser beam to the workpiece from the side of the first surface of the workpiece. The laser beam applying means may be configured to apply the laser beam to the workpiece from the side of the second surface of the workpiece.

The laser beam applying means may be configured to apply the laser beam to the workpiece at least in a plurality of positions along the first surface in such a manner that adjacent ones of the positions do not overlap each other. The laser beam applying means may be configured to apply the laser beam to the workpiece at least in a plurality of positions along the first surface in such a manner that a distance between adjacent ones of the positions, i.e., a distance between centres of adjacent positions, is within a range of 3 µm to 50 µm, preferably 5 µm to 40 µm and more preferably 8 µm to 30 µm. The distance between outer edges of adjacent or neighbouring modified regions may be at least 1 µm.

The laser beam applying means may be configured to apply the laser beam to the workpiece at least in a plurality of positions along the first surface in such a manner that adjacent ones of the positions at least partially overlap each other.

The modified layer forming means may be configured to form the modified layer so as to be substantially parallel to the first surface of the workpiece.

The modified layer forming means may be configured to form the modified layer so as to be closer to the first surface of the workpiece than to the second surface of the workpiece in the thickness direction of the workpiece. For example, the modified layer forming means may be configured to form the modified layer so that a distance between the modified layer and the first surface in the thickness direction of the workpiece is smaller than a distance between the modified layer and the second surface in the thickness direction of the workpiece by a factor of 3 or more, a factor of 5 or more, a factor of 8 or more, a factor of 10 or more, a factor of 15 or more or a factor of 20 or more.

The modified layer forming means may be configured to form the modified layer so that a distance between the modified layer and the first surface in the thickness direction of the workpiece is larger than the thickness, e.g., the final thickness, of the substrate to be obtained, e.g., by 30 to 100 µm, preferably 40 to 80 µm, more preferably 50 to 70 µm and even more preferably approximately 50 µm.

The modified layer forming means may be configured to form the modified layer substantially over an entire cross-section of the workpiece. The cross-section may be substantially perpendicular to the thickness direction of the workpiece.

The modified layer forming means may be configured to form the modified layer so as to be surrounded by a peripheral workpiece portion. The peripheral workpiece portion may be the peripheral workpiece portion described above. In particular, the peripheral workpiece portion may be a portion of the workpiece with no or less modification of the workpiece.

The dividing means may be configured to separate or divide the workpiece at the peripheral workpiece portion. For example, the dividing means may further comprise a separating means configured to separate or divide the workpiece at the peripheral workpiece portion.

The separating means may be configured to cut the workpiece at the peripheral workpiece portion. For example, the separating means may comprise or be a mechanical cutting means, e.g., comprising or consisting of a dicer, such as a vertical spindle dicer, a blade, a saw, such as a wire saw, or a cleaving tool, or a laser cutting means, e.g., a laser cutting means configured to perform laser ablation. The mechanical cutting means, such as a cutting tool, for mechanically cutting the workpiece at the peripheral workpiece portion may have a cutting width, e.g., a blade or saw width, of about 30 to 80 µm.

The separating means may be configured to cut the workpiece at the peripheral workpiece portion from a peripheral or circumferential side of the workpiece. The cutting direction may be substantially perpendicular to the thickness direction of the workpiece.

The substrate producing system, in particular, the modified layer forming means, may be configured to form modified regions in the peripheral workpiece portion. For example, the laser beam applying means may be configured to form modified regions in the peripheral workpiece portion by applying the laser beam to the workpiece in the manner described above. The laser beam applying means may be configured to apply the laser beam to the workpiece from the side of the first surface of the workpiece and/or from the side of the second surface of the workpiece and/or from the peripheral or circumferential side of the workpiece.

The substrate producing system, in particular, the modified layer forming means, may be configured to form the modified regions in the peripheral workpiece portion after forming the modified layer inside the workpiece. The substrate producing system, in particular, the modified layer forming means, may be configured to form the modified regions in the peripheral workpiece portion after forming the functional layer on the first surface of the workpiece. The substrate producing system, in particular, the modified layer forming means, may be configured to form the modified regions in the peripheral workpiece portion before applying the external stimulus to the workpiece. The substrate producing system may be configured so that applying the external stimulus to the workpiece divides the workpiece, or contribute to dividing the workpiece, along the modified layer and along the peripheral workpiece portion.

The substrate producing system may further comprise a grinding means and/or a polishing means or a combined grinding and polishing means. The grinding means or the combined grinding and polishing means may be configured to grind a surface of the substrate opposite the first surface where the functional layer is formed, after dividing the workpiece along the modified layer. The polishing means or the combined grinding and polishing means may be configured to polish the surface of the substrate opposite the first surface, after dividing the workpiece along the modified layer, in particular, after grinding the surface of the substrate opposite the first surface.

The substrate producing system may further comprise a metallizing means configured to subject the surface of the substrate opposite the first surface to a metallization process, in particular, after grinding and/or polishing the surface of the substrate opposite the first surface.

The grinding means or the combined grinding and polishing means further may be configured to grind a surface of a remainder of the workpiece, the surface being opposite the second surface of the workpiece, after dividing the workpiece along the modified layer. Alternatively, the substrate producing system may comprise a further grinding means or combined grinding and polishing means for this purpose.

The polishing means or the combined grinding and polishing means further may be configured to polish the surface of the remainder of the workpiece, after dividing the workpiece along the modified layer, in particular, after grinding the surface of the remainder of the workpiece. Alternatively, the substrate producing system may comprise a further polishing means or combined grinding and polishing means for this purpose.

The substrate producing system may be configured to repeat, after dividing the workpiece along the modified layer, the above-described steps of forming a modified layer, forming a functional layer and dividing the workpiece one or more times on a remainder of the workpiece, so as to obtain a plurality of, e.g., two or more, three or more, five or more, eight or more, ten or more, or twelve or more, substrates with functional layers.

The substrate producing system may further comprise an attaching means configured to attach a protective and/or supporting material to the first surface where the functional layer is formed, after forming the functional layer on the first surface of the workpiece. The attaching means may be configured to attach the protective and/or supporting material to the first surface before dividing the workpiece along the modified layer. The protective and/or supporting material may be the protective and/or supporting material described above. In particular, the protective and/or supporting material may comprise or consist of a protective film or sheet as described above. The protective and/or supporting material may further comprise a cushioning layer or a cushioning layer and a base sheet, as has been detailed above.

The external stimulus applying means may be configured to apply an ultrasonic wave to the workpiece and/or to apply pressure to the workpiece and/or to apply a mechanical force to the workpiece and/or to heat the workpiece and/or to cool the workpiece and/or to apply a vacuum to the workpiece. Particularly preferably, the external stimulus applying means is configured to apply an ultrasonic wave to the workpiece.

BRIEF DESCRIPTION OF THE DRAWINGS

Hereinafter, non-limiting examples of the invention are explained with reference to the drawings, in which:

FIG. 14 is a cross-sectional view showing the outcome of a step of dividing the workpiece along the modified layer, thereby obtaining the substrate with the functional layer, according to the second embodiment of the method of the present invention; and FIG. 15 is a partial cross-sectional view showing examples of the thicknesses of different portions of the workpiece according to the first to third embodiments of the method of the present invention.

DETAILED DESCRIPTION OF PREFERRED EMBODIMENTS

Preferred embodiments of the present invention will now be described with reference to the accompanying drawings. The preferred embodiments relate to methods of producing a substrate and to substrate producing systems for performing these methods.

In the following, first to third embodiments of the present invention will be described with reference to FIGS. 1 to 15.

In the first to third embodiments, the method of the invention is performed on an SiC ingot as a workpiece 2 (see, for example, FIGS. 1 to 8). In particular, the workpiece 2 may be a single crystal SiC ingot. However, different types of workpiece and, in particular, different workpiece materials may be used for the workpiece 2, as has been detailed above.

Figure 1:
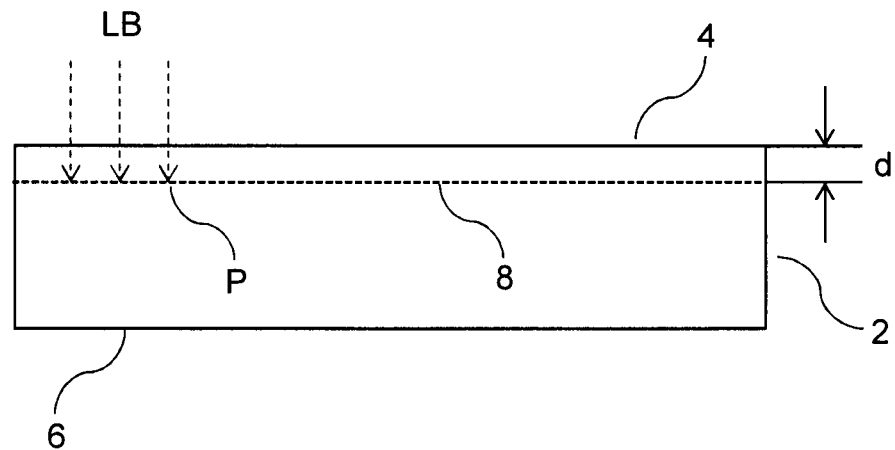
FIG. 1 is a cross-sectional view illustrating a step of applying a laser beam to a workpiece, thereby forming a modified layer inside the workpiece, according to a first embodiment of the method of the present invention.

As is shown in FIG. 1, the workpiece 2 has a first surface 4 and a second surface 6 opposite the first surface 4. The first surface 4 and the second surface 6 are substantially parallel to each other. For example, the workpiece 2 may have a thickness in the range of 1 to 2 mm, in particular, 1.5 mm (see FIG. 15).

A pulsed laser beam LB is applied to the workpiece 2 from the side of the first surface 4 of the workpiece 2 (see FIG. 1). The pulsed laser beam LB may have a pulse width, for example, in the range of 1 ns to 300 ns. The pulsed laser beam LB has a wavelength which allows transmission of the pulsed laser beam LB through the workpiece 2. The pulsed laser beam LB is applied to the workpiece 2 in a plurality of positions along the first surface 4, in a condition where a focal point P of the pulsed laser beam LB is located at a distance d from the first surface 4 in the direction from the first surface 4 towards the second surface 6, i.e., located inside the workpiece 2 (see FIG. 1).

The pulsed laser beam LB is applied to the workpiece 2 by a laser beam applying means (not shown) of a substrate producing system (not shown) according to an embodiment of the present invention. In this embodiment, the laser beam applying means constitutes a modified layer forming means of the system. During the process of applying the pulsed laser beam LB to the workpiece 2, the workpiece 2 may be supported by a support member (not shown) of the substrate producing system.

Figure 2:
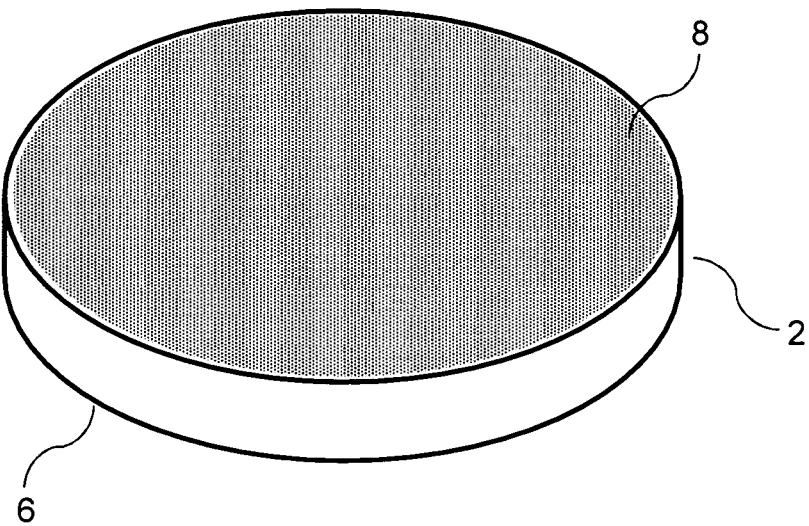
FIG. 2 is a perspective partial view showing the workpiece of FIG. 1 after formation of the modified layer.
Figure 3:
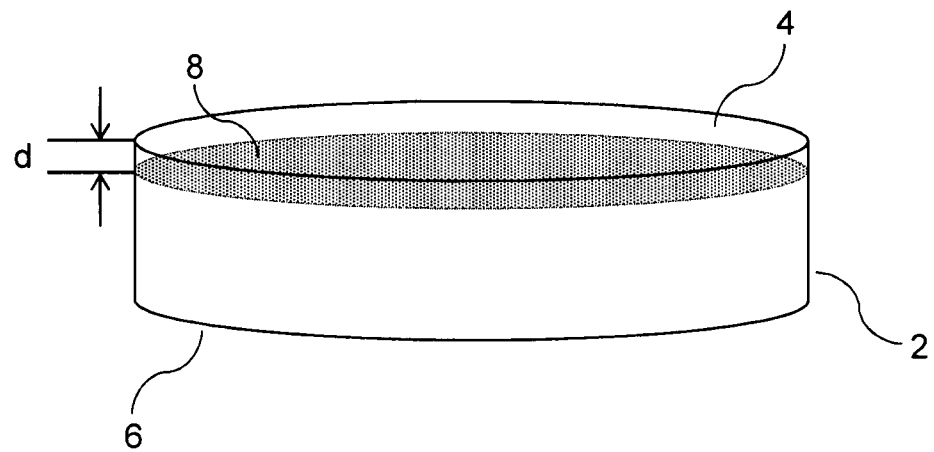
FIG. 3 is a perspective phantom view showing the workpiece of FIG. 1 after formation of the modified layer.

By applying the pulsed laser beam LB to the workpiece 2 in this manner, a modified layer 8 is formed inside the workpiece 2 (see FIGS. 1 to 3). The modified layer 8 comprises a plurality of modified regions (not shown). The modified layer 8 faces the first surface 4 of the workpiece 2, i.e., the modified layer 8 is opposite the first surface 4 in the direction from the first surface 4 towards the second surface 6. The modified layer 8 is formed so as to be substantially parallel to the first surface 4.

The modified regions of the modified layer 8 are regions of the workpiece 2 which have been modified by the application of the pulsed laser beam LB. In particular, the modified regions may be regions of the workpiece 2 in which the structure of the workpiece material has been modified by the application of the pulsed laser beam LB and/or the workpiece 2 has been damaged by the application of the pulsed laser beam LB. By forming the modified layer 8 inside the workpiece 2, the strength of the workpiece 2 is reduced along the modified layer 8.

While, in the methods of the first to third embodiments, the modified layer 8 is formed by applying a laser beam LB to the workpiece 2, the present invention is not limited to this approach. The modified layer 8 may be formed in the workpiece 2 in a different way, for example, by applying a different type of radiation to the workpiece 2.

The modified regions may comprise amorphous regions and/or regions in which cracks are formed. The modified regions may be amorphous regions or regions in which cracks are formed. The modified regions may have diameters in the range of 1 μm to 30 μm, preferably 2 μm to 20 μm and more preferably 3 μm to 10 μm.

As is shown in the cross-sectional view of FIG. 1, in the perspective partial view of FIG. 2 and in the perspective phantom view of FIG. 3, the modified layer 8 is formed substantially over an entire cross-section of the workpiece 2, the cross-section being substantially perpendicular to the thickness direction of the workpiece 2. In this regard, it is to be noted that the partial view of FIG. 2 shows only a portion of the workpiece 2, namely the portion of the workpiece 2 which extends from the second surface 6 to the modified layer 8. Thus, FIG. 2 substantially shows the workpiece 2 with the upper portion thereof, which will form the substrate, removed (see also the substrate 16 in FIG. 14).

The pulsed laser beam LB may be applied to the workpiece 2 at least in a plurality of positions along the first surface 4 in such a manner that adjacent ones of the positions do not overlap each other. The pulsed laser beam LB may be applied to the workpiece 2 at least in a plurality of positions along the first surface 4 in such a manner that a distance between adjacent ones of the positions, i.e., a distance between centres of adjacent positions, is within a range of 3 μm to 50 μm, preferably 5 μm to 40 μm and more preferably 8 μm to 30 μm.

By applying the pulsed laser beam LB in this manner, the plurality of modified regions in the modified layer 8 can be formed inside the workpiece 2 so that adjacent or neighbouring modified regions do not overlap each other. The distance between outer edges of adjacent or neighbouring modified regions may be at least 1 μm.

Alternatively, the pulsed laser beam LB may be applied to the workpiece 2 at least in a plurality of positions along the first surface 4 in such a manner that adjacent ones of the positions at least partially overlap each other. In this way, the plurality of modified regions of the modified layer 8 may be formed in the workpiece 2 so that adjacent or neighbouring modified regions at least partially overlap each other.

As is further shown in FIGS. 1 and 3, the modified layer 8 is formed so as to be closer to the first surface 4 of the workpiece 2 than to the second surface 6 of the workpiece 2 in the thickness direction of the workpiece 2.

The pulsed laser beam LB is applied to the workpiece 2 in a condition where the focal point P of the pulsed laser beam LB is located at the distance d from the first surface 4 in the direction from the first surface 4 towards the second surface 6. Thus, the modified layer 8 is formed inside the workpiece 2 at the distance d from the first surface 4 in the thickness direction of the workpiece 2 (see FIGS. 1 and 3). In the present embodiment, the distance d between the modified layer 8 and the first surface 4 in the thickness direction of the workpiece 2 is larger than the final thickness of the substrate to be obtained (approximately 70 μm; see FIG. 15) by approximately 50 μm.

Figure 4:
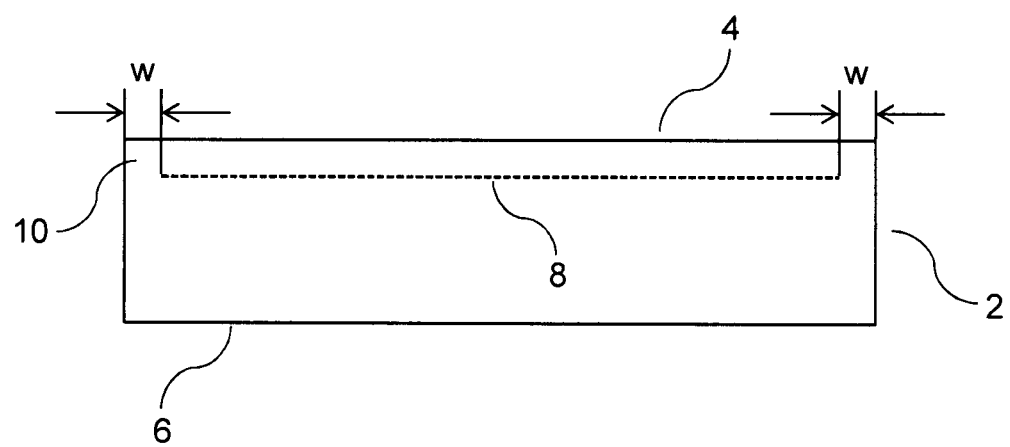
FIG. 4 is a cross-sectional view illustrating a step of applying a laser beam to a workpiece, thereby forming a modified layer inside the workpiece, according to a second embodiment of the method of the present invention.
Figure 5:
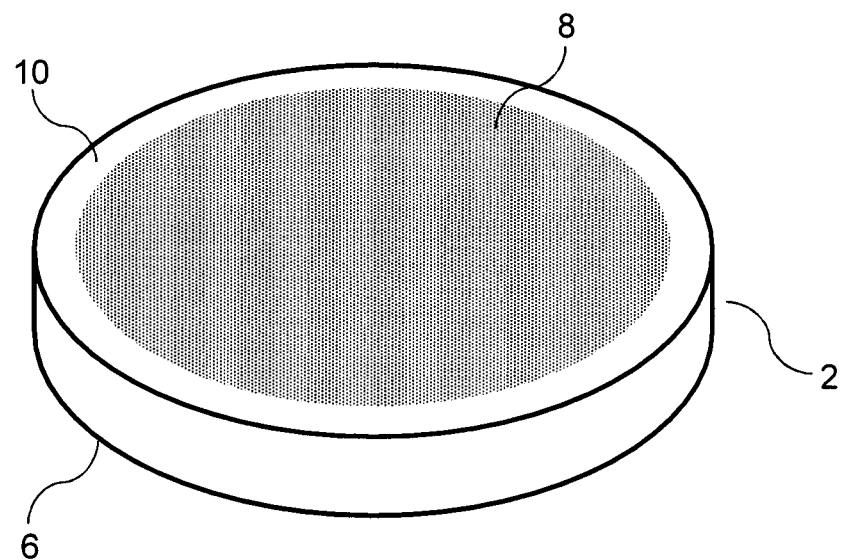
FIG. 5 is a perspective partial view showing the workpiece of FIG. 4 after formation of the modified layer.
Figure 6:
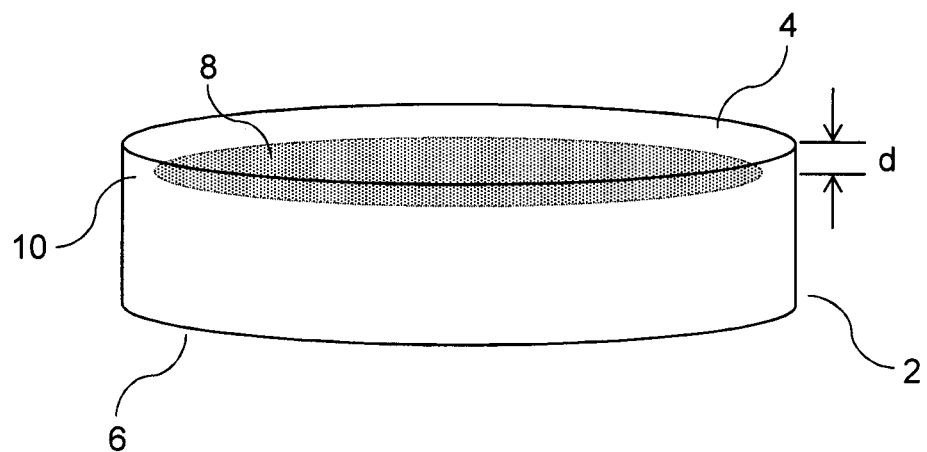
FIG. 6 is a perspective phantom view showing the workpiece of FIG. 4 after formation of the modified layer.

FIGS. 4 to 6 illustrate a step of applying the pulsed laser beam LB to the workpiece 2, thereby forming the modified layer 8 inside the workpiece 2, according to a second embodiment of the present invention. The workpiece 2 of the second embodiment is identical to the workpiece 2 of the first embodiment. The partial view of FIG. 5 shows only a portion of the workpiece 2, namely the portion of the workpiece 2 which extends from the second surface 6 to the modified layer 8. Thus, FIG. 5 substantially shows the workpiece 2 with the upper portion thereof, which will form the substrate, removed.

The method of the second embodiment differs from the method of the first embodiment in that the modified layer 8 is formed so as to be surrounded by a peripheral workpiece portion 10 (see FIGS. 4 to 6). In the peripheral workpiece portion 10 of the second embodiment, no modified regions are formed. Alternatively, the peripheral workpiece portion 10 may be modified to a lesser degree than the modified layer 8, as has been detailed above. An example of such a modification of the peripheral workpiece portion 10 to a lesser degree will be described below for the third embodiment of the present invention.

The peripheral workpiece portion 10 has a substantially annular shape and surrounds the modified layer 8 in an extension plane of the modified layer 8, i.e., in a plane in which the modified layer 8 extends. The extension plane of the modified layer 8 is substantially parallel to the first surface 4 (see FIG. 4). The peripheral workpiece portion 10 extends along a periphery or circumference of the workpiece 2. The modified layer 8 is arranged in a central portion of the workpiece 2 (see, in particular, FIG. 5). The modified layer 8 is formed inside the workpiece 2 at the distance d from the first surface 4 in the thickness direction of the workpiece 2 (see FIG. 6). In the present embodiment, the distance d is larger than the final thickness of the substrate to be obtained (approximately 70 µm; see FIG. 15) by approximately 50 µm.

The annular peripheral workpiece portion 10 has a ring width w (see FIG. 4) of 0.1 to 2 mm. The peripheral workpiece portion 10 may correspond to a peripheral marginal area of a substrate to be obtained from the workpiece 2 in which no devices, in particular, no active devices, are to be formed.

Figure 7:
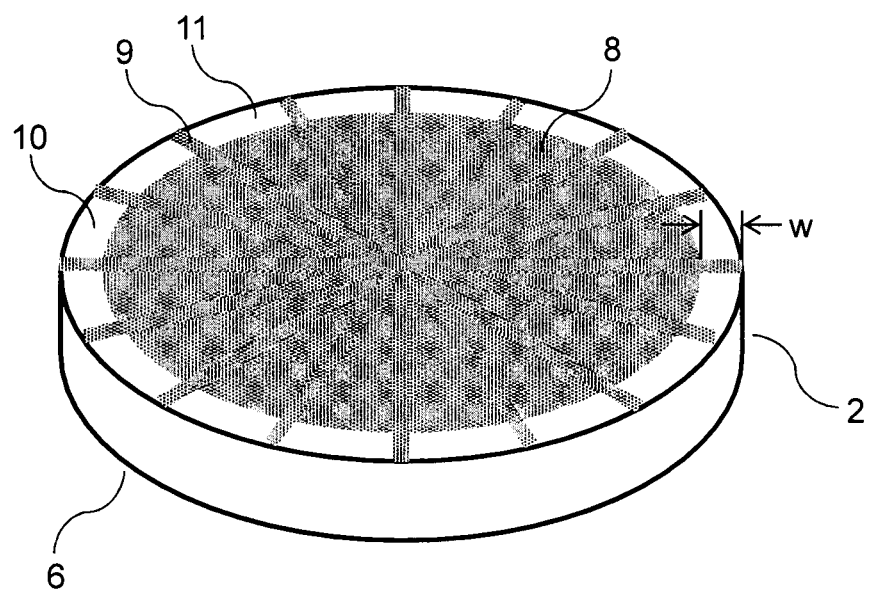
FIG. 7 is a perspective partial view showing a workpiece after formation of a modified layer according to a third embodiment of the method of the present invention.
Figure 8:
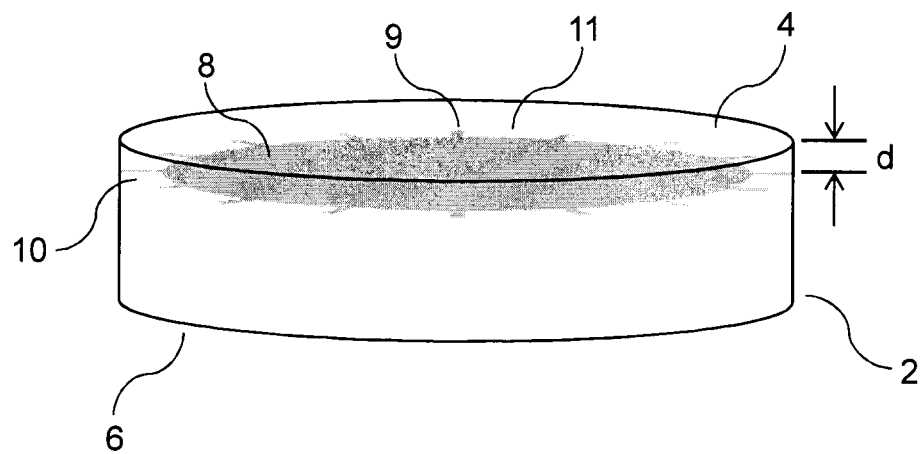
FIG. 8 is a perspective phantom view showing the workpiece of FIG. 7.

FIGS. 7 and 8 show the outcome of a step of forming the modified layer 8 inside the workpiece 2 according to a third embodiment of the present invention. The workpiece 2 of the third embodiment is identical to the workpiece 2 of the first and second embodiments. The partial view of FIG. 7 shows only a portion of the workpiece 2, namely the portion of the workpiece 2 which extends from the second surface 6 to the modified layer 8. Thus, FIG. 7 substantially shows the workpiece 2 with the upper portion thereof, which will form the substrate, removed.

The method of the third embodiment differs from the method of the first embodiment in that the modified layer 8 is formed so as to be surrounded by a peripheral workpiece portion 10 (see FIGS. 7 and 8). In the peripheral workpiece portion 10, the workpiece 2 is modified to a lesser degree than in the modified layer 8, as will be further detailed below.

The peripheral workpiece portion 10 has a substantially annular shape and surrounds the modified layer 8 in an extension plane of the modified layer 8, i.e., in a plane in which the modified layer 8 extends. The extension plane of the modified layer 8 is substantially parallel to the first surface 4. The peripheral workpiece portion 10 extends along a periphery or circumference of the workpiece 2. The modified layer 8 is arranged in a central portion of the workpiece 2 (see FIG. 7). The modified layer 8 is formed inside the workpiece 2 at the distance d from the first surface 4 in the thickness direction of the workpiece 2 (see FIG. 8).

The annular peripheral workpiece portion 10 has a ring width w (see FIG. 7) of 0.1 to 2 mm. The peripheral workpiece portion 10 may correspond to a peripheral marginal area of a substrate to be obtained from the workpiece 2 in which no devices, in particular, no active devices, are to be formed.

In the peripheral workpiece portion 10 of the third embodiment, areas 9 in which modified regions (not shown) are formed and areas 11 in which no modified regions are formed are alternatingly arranged along the circumference of the workpiece 2 (see FIGS. 7 and 8). The areas 9 in which modified regions are formed are, at least substantially, equidistantly spaced from each other in the circumferential direction of the workpiece 2. The areas 11 in which no modified regions are formed are, at least substantially, equidistantly spaced from each other in the circumferential direction of the workpiece 2. All of the areas 9 in which modified regions are formed have the same size, i.e., the same extensions in the thickness direction of the workpiece 2 and in directions perpendicular thereto. All of the areas 11 in which no modified regions are formed have the same size. All of the areas 9 in which modified regions are formed extend all the way to the peripheral edge of the workpiece 2 (see FIG. 7). All of the areas 11 in which no modified regions are formed extend all the way to the peripheral edge of the workpiece 2 (see FIG. 7).

In the peripheral workpiece portion 10 of the third embodiment, the extensions in the circumferential direction of the workpiece 2 of the areas 9 in which modified regions are formed are smaller than the extensions in the circumferential direction of the workpiece 2 of the areas 11 in which no modified regions are formed (see FIG. 7). Alternatively, the extensions in the circumferential direction of the workpiece 2 of the areas 9 in which modified regions are formed may be equal to or larger than the extensions in the circumferential direction of the workpiece 2 of the areas 11 in which no modified regions are formed.

The modified regions in the modified layer 8 and the modified regions in the areas 9 of the peripheral workpiece portion 10 are formed at the same distance d from the first surface 4 in the direction from the first surface 4 towards the second surface 6, i.e., are located at the same depth inside the workpiece 2 (see FIG. 8). In the present embodiment, the distance d is larger than the final thickness of the substrate to be obtained (approximately 70 µm; see FIG. 15) by approximately 50 µm.

The modified regions in the modified layer 8 and the modified regions in the areas 9 of the peripheral workpiece portion 10 are formed in the same manner (and in the same manner in which the modified regions in the modified layer 8 are formed in the methods according to the first and second embodiments), namely by applying the pulsed laser beam LB to the workpiece 2, from the side of the first surface 4 of the workpiece 2, in a condition where the focal point P of the pulsed laser beam LB is located at the distance d from the first surface 4 in the direction from the first surface 4 towards the second surface 6 (see FIG. 1).

In the areas 9 of the peripheral workpiece portion 10, the number of modified regions per unit area of the workpiece 2 may be, at least substantially, the same as in the modified layer 8. Alternatively, in the areas 9 of the peripheral workpiece portion 10, fewer or more modified regions per unit area of the workpiece 2 may be formed than in the modified layer 8.

In the areas 9 of the peripheral workpiece portion 10, distances between adjacent or neighbouring modified regions may be, at least substantially, the same as in the modified layer 8. Alternatively, in the areas 9 of the peripheral workpiece portion 10, distances between at least some of adjacent or neighbouring modified regions may be larger or smaller than in the modified layer 8.

In the method according to the third embodiment, the modified regions formed in the areas 9 of the peripheral workpiece portion 10 are modified, at least substantially, to the same degree as the modified regions in the modified layer 8. This is achieved by applying the same pulsed laser beam LB as for forming the modified layer 8. Alternatively, the modified regions formed in the areas 9 of the peripheral workpiece portion 10 may be modified to a lesser or higher degree than the modified regions in the modified layer 8, for example, by applying a different, e.g., weaker or stronger, laser beam than for forming the modified layer 8.

In the method according to the third embodiment, the modified regions formed in the areas 9 of the peripheral workpiece portion 10 have, at least substantially, the same size as the modified regions in the modified layer 8. Alternatively, the modified regions in the areas 9 of the peripheral workpiece portion 10 may be smaller or larger than the modified regions in the modified layer 8.

The following description of subsequent process steps relates to the second embodiment of the invention. However, these steps may be performed substantially in the same manner in the methods of the first and third embodiments of the invention.

Figure 9:
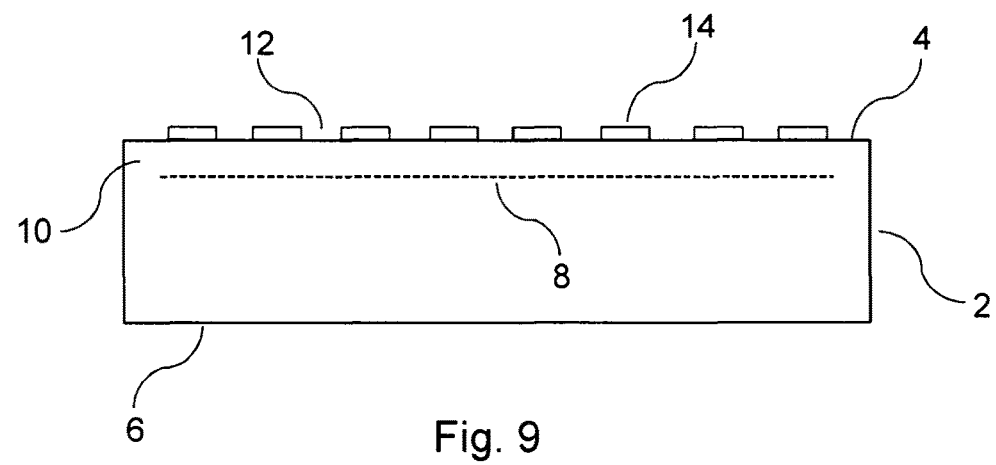
FIG. 9 is a cross-sectional view showing the outcome of a step of forming a functional layer on a first surface of the workpiece according to the second embodiment of the method of the present invention.

After forming the modified layer 8 inside the workpiece 2, a functional layer 12 is formed on the first surface 4 of the workpiece 2. The outcome of the step of forming the functional layer 12 is shown in FIG. 9. The functional layer 12 is formed by a functional layer forming means (not shown) of the substrate producing system of the present embodiment. Forming the functional layer 12 on the first surface 4 of the workpiece 2 may involve high temperature processes.

In the present embodiment, the functional layer 12 provides an electronic functionality. In particular, the functional layer 12 is a device layer comprising a plurality of devices 14. The devices 14 may comprise or be, for example, transistors, such as SiC MOSFETs or IGBTs, or diodes, e.g., Schottky barrier diodes. However, other types of functional layer may be used as the functional layer 12, as has been detailed above.

After forming the functional layer 12 on the first surface 4 of the workpiece 2, the workpiece 2 is divided along the modified layer 8, thereby obtaining a substrate 16 with the functional layer 12 (see FIG. 14). The process of dividing the workpiece 2 will be described in detail below with reference to FIGS. 10 to 14.

Figure 10:
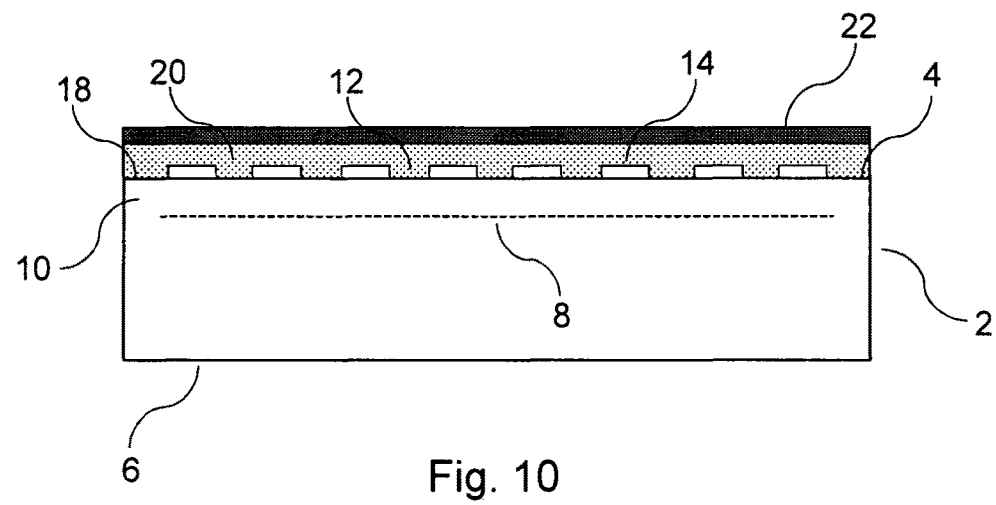
FIG. 10 is a cross-sectional view showing the outcome of a step of attaching a protective and supporting material to the first surface of the workpiece according to the second embodiment of the method of the present invention.

Specifically, after forming the functional layer 12 on the first surface 4 of the workpiece 2, a protective and supporting material is attached to the first surface 4 where the functional layer 12 is formed. The outcome of the step of attaching the protective and supporting material to the first surface 4 is shown in FIG. 10. The protective and supporting material is attached to the first surface 4 by an attaching means (not shown) of the substrate producing system of the present embodiment.

The protective and supporting material comprises a protective film 18, a cushioning layer 20 and a base sheet 22 (see, for example, FIG. 10).

The protective film 18 may be applied to the first surface 4 so that an entire front surface of the protective film 18 is in direct contact with the first surface 4. In this case, the protective film 18 may be attached to the first surface 4 by applying an external stimulus to the protective film 18 during and/or after applying the protective film 18 to the first surface 4. Applying the external stimulus to the protective film 18 may comprise or consist of heating the protective film 18 and/or cooling the protective film 18 and/or applying a vacuum to the protective film 18 and/or irradiating the protective film 18 with radiation, such as light, e.g., by using a laser beam. The external stimulus may comprise or be a chemical compound and/or electron or plasma irradiation and/or mechanical treatment, such as pressure, friction or ultrasound application, and/or static electricity.

Alternatively or in addition, the protective film 18 may be provided with an adhesive layer (not shown), wherein the adhesive layer is provided only in a peripheral area of the front surface of the protective film 18. In this case, no adhesive is present in a central area of the front surface of the protective film 18. In the central area of the front surface of the protective film 18, the front surface of the protective film 18 and the first surface 4 may be in direct contact with each other. The protective film 18 may be applied to the first surface 4 so that the adhesive layer comes into contact only with a peripheral portion of the first surface 4. The peripheral portion of the first surface 4 with which the adhesive layer comes into contact may be, for example, a peripheral marginal area of the first surface 4. In this peripheral marginal area, no functional layer 12, in particular, no devices 14, may be present.

The protective film 18 may be made of a plastic material, such as a polymer. For example, the protective film 18 may be made of a polyolefin. In particular, the protective film 18 may be made of polyethylene (PE), polypropylene (PP) or polybutylene (PB).

The protective film 18 may be heat resistant up to a temperature of 180° C. or more, preferably up to a temperature of 220° C. or more, more preferably up to a temperature of 250° C. or more, and even more preferably up to a temperature of 300° C. or more.

The protective film 18 may have a thickness in the range of 5 to 200 μm, preferably 8 to 100 μm, more preferably 10 to 80 μm and even more preferably 12 to 50 μm.

The cushioning layer 20 is attached to a back surface of the protective film 18 opposite to the front surface thereof. Protrusions projecting from the first surface 4 along the thickness direction of the workpiece 2 are embedded in the cushioning layer 20.

The cushioning layer 20 may be formed of any type of material which allows for protrusions protruding along the thickness direction of the workpiece 2 to be embedded therein. For example, the cushioning layer may be formed of a resin, an adhesive, a gel or the like. The cushioning layer 20 may be curable by an external stimulus, as has been detailed above. For example, the cushioning layer 20 may be formed of a curable resin, a curable adhesive, a curable gel or the like.

The cushioning layer 20 may be heat resistant up to a temperature of 180° C. or more, preferably up to a temperature of 220° C. or more, more preferably up to a temperature of 250° C. or more, and even more preferably up to a temperature of 300° C. or more.

The cushioning layer 20 may have a thickness in the range of 10 to 300 μm, preferably 20 to 250 μm and more preferably 50 to 200 μm.

The base sheet 22 is attached to the back surface of the cushioning layer 20 opposite to the front surface thereof which is attached to the protective film 18.

The base sheet 22 may be made of a soft or pliable material, such as, for example, a polymer material, e.g., polyvinyl chloride (PVC), ethylene vinyl acetate (EVA) or a polyolefin. Alternatively, the base sheet 22 may be made of a rigid or hard material, such as polyethylene terephthalate (PET) and/or silicon and/or glass and/or stainless steel (SUS). Also, the base sheet 22 may be formed of a combination of the materials listed above.

The base sheet 22 may be heat resistant up to a temperature of 180° C. or more, preferably up to a temperature of 220° C. or more, more preferably up to a temperature of 250° C. or more, and even more preferably up to a temperature of 300° C. or more.

The base sheet 22 may have a thickness in the range of 30 to 1500 μm, preferably 40 to 1200 μm and more preferably 50 to 1000 μm.

A front surface of the base sheet 22 is in contact with the back surface of the cushioning layer 20, and a back surface of the base sheet 22 opposite to the front surface thereof is substantially parallel to the first surface 4 of the workpiece 2 and to the modified layer 8 formed inside the workpiece 2 (see FIG. 10). Thus, during further processing, such as grinding and/or polishing, a suitable counter pressure can be applied to the back surface of the base sheet 22, e.g., by placing this back surface on the support member of the substrate producing system, such as a chuck table.

After attaching the protective and supporting material to the first surface 4 of the workpiece 2, an external stimulus is applied to the workpiece 2. The substrate producing system has a dividing means (not shown) comprising an external stimulus applying means (not shown). The external stimulus is applied to the workpiece 2 by the external stimulus applying means.

In the present embodiment, applying the external stimulus to the workpiece 2 consists of applying an ultrasonic wave to the workpiece 2. However, other types of external stimulus may be applied to the workpiece 2, as has been detailed above.

By applying the external stimulus to the workpiece 2, the workpiece 2 is separated in the area where the modified layer 8 is formed. In this area, the strength of the workpiece 2 is reduced due to the presence of the modified regions, thus facilitating separation of the workpiece 2 by the application of the external stimulus.

Figure 11:
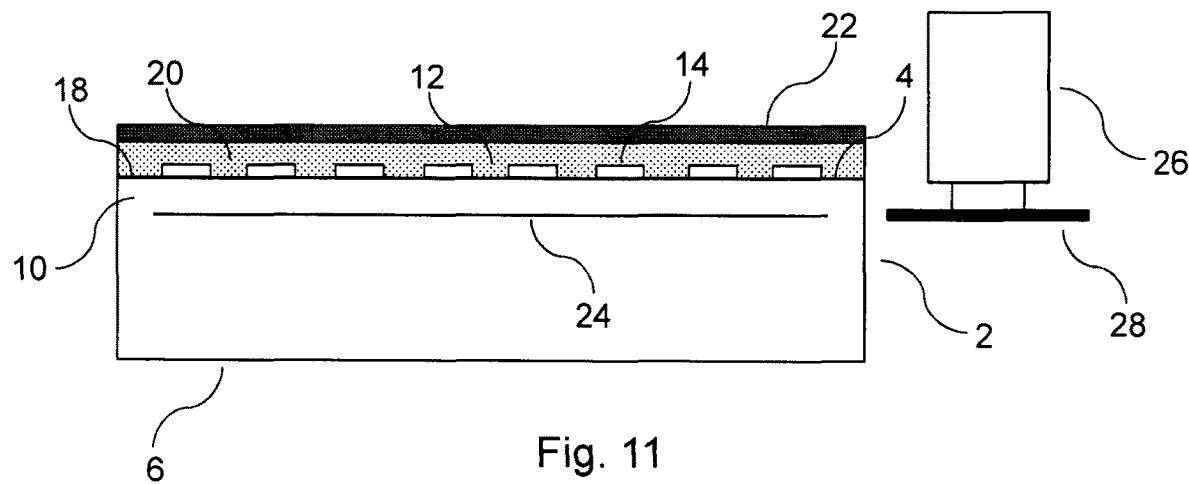
FIG. 11 is a cross-sectional view showing the outcome of a step of applying an external stimulus to the workpiece and illustrating a preparatory step for cutting the workpiece at a peripheral workpiece portion according to the second embodiment of the method of the present invention.

The outcome of the step of applying the external stimulus to the workpiece 2 is shown in FIG. 11. Since the modified layer 8 has been formed so as to be surrounded by the peripheral workpiece portion 10, in which no modified regions are formed, the workpiece 2 is separated by the application of the external stimulus only in the area where the modified layer 8 is formed. This is illustrated in FIG. 11 by a solid line indicating a separation layer 24 where the workpiece 2 has been separated along the modified layer 8. However, the partly separated portions of the workpiece 2 are still connected to each other at the peripheral workpiece portion 10. Thus, dividing, i.e., fully dividing, the workpiece 2, so as to obtain the substrate 16 with the functional layer 12, further comprises separating the workpiece 2 at the peripheral workpiece portion 10, as will be detailed below.

If the modified layer 8 is formed substantially over the entire cross-section of the workpiece 2, as is the case for the first embodiment (see FIGS. 1 and 2), the workpiece 2 is fully divided along the modified layer 8 by applying the external stimulus, thereby obtaining the substrate 16 with the functional layer 12.

In the method according to the third embodiment, areas 9 in which modified regions are formed and areas 11 in which no modified regions are formed are alternatingly arranged along the circumference of the workpiece 2 in the peripheral workpiece portion 10 (see FIGS. 7 and 8). The modified regions in the modified layer 8 and the modified regions in the areas 9 of the peripheral workpiece portion 10 are formed in the same manner. By applying the external stimulus to the workpiece 2 in the method of the third embodiment, the workpiece 2 is separated in the area where the modified layer 8 is formed and in the areas 9 of the peripheral workpiece portion 10 in which modified regions are formed. However, the partly separated portions of the workpiece 2 are still connected to each other at the areas 11 of the peripheral workpiece portion 10 in which no modified regions are formed. Thus, dividing, i.e., fully dividing, the workpiece 2, so as to obtain the substrate 16 with the functional layer 12, further comprises fully separating the workpiece 2 at the peripheral workpiece portion 10, i.e., also in the areas 11 in which no modified regions are formed. This separation process can be performed substantially in the same manner as detailed below for the method of the second embodiment. In the method according to the third embodiment, the process of fully separating the workpiece 2 at the peripheral workpiece portion 10 is significantly facilitated by the presence of the areas 9.

After applying the external stimulus to the workpiece 2, the workpiece 2 is separated at the peripheral workpiece portion 10. In the present embodiment, the workpiece 2 is cut at the peripheral workpiece portion 10 by using a mechanical cutting means 26 (see FIGS. 11 and 12), namely a vertical spindle dicer. The dividing means of the substrate producing system comprises the mechanical cutting means 26. The mechanical cutting means 26 constitutes a separating means of the present embodiment. The mechanical cutting means 26 has a rotating cutting blade 28 with a cutting width, i.e., a blade width, of about 30 to 80 μm.

Figure 12:
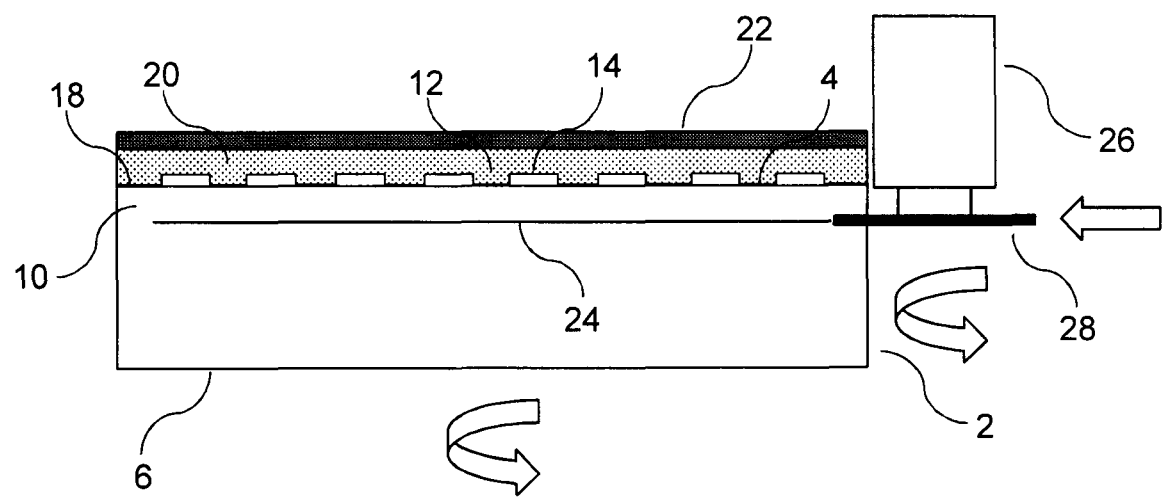
FIG. 12 is a cross-sectional view illustrating a step of cutting the workpiece at the peripheral workpiece portion according to the second embodiment of the method of the present invention.

The process of cutting the workpiece 2 at the peripheral workpiece portion 10 is illustrated in FIG. 12. In this process, the cutting blade 28 of the mechanical cutting means 26 and the workpiece 2 are rotated in the same rotation direction, as is indicated by curved arrows in FIG. 12. Alternatively, the cutting blade 28 of the mechanical cutting means 26 and the workpiece 2 may be rotated in opposite rotation directions. The workpiece 2 may be rotated by rotating the support member of the substrate producing system. Further, the cutting blade 28 is brought into contact with the peripheral workpiece portion 10 by moving the cutting blade 28 towards the separation layer 24 in a direction, i.e., a cutting direction, which is substantially perpendicular to the thickness direction of the workpiece 2, as is indicated by a horizontal arrow in FIG. 12. Thus, the workpiece 2 is cut at the peripheral workpiece portion 10 from a peripheral or circumferential side of the workpiece 2. When the cutting blade 28 has reached the area where the separation layer 24 is present, the workpiece 2 is fully divided and the cutting process is stopped. In this fully divided state of the workpiece 2, the substrate 16 having the functional layer 12 is obtained (see FIG. 14), as will be further detailed below.

Figure 13:
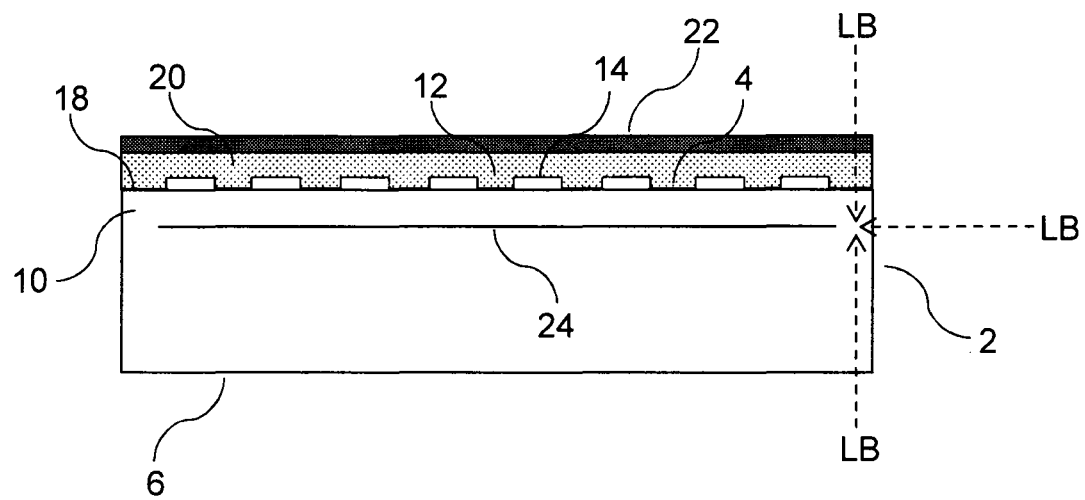
FIG. 13 is a cross-sectional view illustrating a step of applying a laser beam to the peripheral workpiece portion, thereby forming modified regions in the peripheral workpiece portion, according to the second embodiment of the method of the present invention.

FIG. 13 illustrates an optional step of applying a laser beam, in particular, the pulsed laser beam LB, to the peripheral workpiece portion 10, thereby forming modified regions (not shown) in the peripheral workpiece portion 10. The pulsed laser beam LB may be applied in the same manner as described above for forming the modified layer 8. The pulsed laser beam LB may be applied to the workpiece 2 from the side of the first surface 4 of the workpiece 2 and/or from the side of the second surface 6 of the workpiece 2 and/or from the peripheral or circumferential side of the workpiece 2, as is indicated in FIG. 13.

The modified regions may be formed in the peripheral workpiece portion 10 before or after attaching the protective and supporting material to the first surface 4. The modified regions are formed in the peripheral workpiece portion 10 before applying the external stimulus to the workpiece 2. Hence, applying the external stimulus to the workpiece 2 may divide the workpiece 2 along the modified layer 8 and along the peripheral workpiece portion 10, thus fully dividing the workpiece 2. In this case, the step of cutting the peripheral workpiece portion 10 (see FIGS. 11 and 12) is omitted.

FIG. 14 shows the outcome of the process of fully dividing the workpiece 2 along the modified layer 8 and the peripheral workpiece portion 10. By dividing the workpiece 2, the substrate 16 with the functional layer 12 is obtained. Specifically, the substrate 16 is separated from a remainder 30 of the workpiece 2. In the first and second embodiments, the substrate 16 is an SiC substrate.

After dividing the workpiece 2, a surface 32 of the substrate 16 opposite the first surface 4 is ground and optionally polished. In the grinding step, and possibly the optional polishing step, the substrate 16 is adjusted to the final substrate thickness. The grinding step is performed by a grinding means (not shown) of the substrate producing system. The optional polishing step is performed by a polishing means (not shown) of the substrate producing system. Alternatively, the substrate producing system may comprise a combined grinding and polishing means (not shown).

After grinding and optionally polishing the surface 32 of the substrate 16 opposite the first surface 4, the surface 32 may be subjected to a metallization process. For this purpose, the substrate producing system may comprise a metallizing means (not shown).

The protective film 18, the cushioning layer 20 and the back sheet 22 may be removed from the first surface 4 after grinding and optionally polishing the surface 32 of the substrate 16. Alternatively, the protective film 18, the cushioning layer 20 and the back sheet 22 may be removed from the first surface 4 after the surface 32 of the substrate 16 has been subjected to the metallization process.

After dividing the workpiece 2, a surface 34 of the remainder 30 of the workpiece 2, the surface 34 being opposite the second surface 6 of the workpiece 2, is ground and polished. In this way, the remainder 30 of the workpiece 2 can be efficiently prepared for obtaining a further substrate therefrom.

The grinding means or the combined grinding and polishing means further may be configured to grind the surface 34 of the remainder 30 of the workpiece 2. Alternatively, the substrate producing system may comprise a further grinding means (not shown) or a further combined grinding and polishing means (not shown) for this purpose.

The polishing means or the combined grinding and polishing means further may be configured to polish the surface 34 of the remainder 30 of the workpiece 2. Alternatively, the substrate producing system may comprise a further polishing means (not shown) or combined grinding and polishing means for this purpose.

After dividing the workpiece 2, the above-described steps of forming the modified layer 8, forming the functional layer 12 and dividing the workpiece 2 may be repeated one or more times on the remainder 30 of the workpiece 2, so as to obtain a plurality of, e.g., two or more, three or more, five or more, eight or more, ten or more, or twelve or more, substrates 16 with functional layers 12. In this way, plural substrates 16 can be obtained from a single workpiece 2 in an efficient and reliable manner. In particular, the method of the invention allows for the number of substrates 16 to be obtained from the workpiece 2 to be increased, as has been explained in detail above.

FIG. 15 shows examples of the thicknesses of different portions of the workpiece 2 according to the first to third embodiments. As is shown in this drawing, the workpiece 2 may have a thickness of 1.5 mm. The desired final thickness of the substrate 16 to be obtained from the workpiece 2 may be approximately 70 μm (see portion 1 in FIG. 15). The modified layer 8 may be formed so that the distance d between the modified layer 8 and the first surface 4 in the thickness direction of the workpiece 2 (see FIGS. 1, 3, 6 and 8) is larger than this final thickness of the substrate 16 by approximately 50 μm (see portion 2 in FIG. 15). In the grinding and/or polishing process, the thickness of the substrate 16 may be reduced by approximately 50 μm so as to arrive at the desired final substrate thickness. The thickness of the remainder 30 of the workpiece 2 may be reduced in the grinding and polishing process by approximately 50 μm (see portion 3 in FIG. 15).

Hence, a 170 μm thick portion of workpiece material is required for producing one substrate 16. Thus, it is possible to obtain eight substrates 16 from the workpiece 2 having a thickness of 1.5 mm.

Substrates 16 with a thickness as small as 70 μm can be particularly efficiently and reliably produced by keeping the workpiece 2 at least partly connected at the peripheral workpiece portion 10 during a substantive part of the substrate producing process, as has been detailed above for the second and third embodiments.

The invention claimed is:

1. A method of producing a substrate with a functional layer, the method comprising:
   providing a workpiece having a first surface and a second surface opposite the first surface;
   forming a modified layer inside the workpiece, the modified layer comprising a plurality of modified regions;
   after forming the modified layer inside the workpiece, forming the functional layer on the first surface of the workpiece; and
   after forming the functional layer on the first surface of the workpiece, dividing the workpiece along the modified layer, thereby obtaining the substrate with the functional layer,
   wherein dividing the workpiece along the modified layer comprises applying an external stimulus to the workpiece.

2. The method according to claim 1, wherein forming the modified layer inside the workpiece comprises applying a laser beam to the workpiece, wherein the workpiece is made of a material which is transparent to the laser beam and the laser beam is applied to the workpiece at least in a plurality of positions along the first surface, in a condition where a focal point of the laser beam is located at a distance from the first surface in the direction from the first surface towards the second surface.

3. The method according to claim 2, wherein the laser beam is applied to the workpiece from the side of the first surface of the workpiece.

4. The method according to a claim 1, wherein the modified layer is formed so as to be substantially parallel to the first surface.

5. The method according to claim 1, wherein the modified layer is formed so as to be surrounded by a peripheral workpiece portion in which no modified regions are formed.

6. The method according to claim 5, wherein dividing the workpiece along the modified layer further comprises separating the workpiece at the peripheral workpiece portion.

7. The method according to claim 1, further comprising, after dividing the workpiece along the modified layer, grinding and/or polishing a surface of the substrate opposite the first surface where the functional layer is formed.

8. The method according to claim 1, further comprising, after dividing the workpiece along the modified layer, grinding and/or polishing a surface of a remainder of the workpiece, the surface being opposite the second surface of the workpiece.

9. The method according to claim 1, wherein, after dividing the workpiece along the modified layer, the steps of forming a modified layer, forming a functional layer and dividing the workpiece are repeated one or more times on a remainder of the workpiece, so as to obtain a plurality of substrates with functional layers.

10. The method according to claim 1, wherein the modified regions comprise amorphous regions or regions in which cracks are formed, or the modified regions are amorphous regions or regions in which cracks are formed.

11. The method according to claim 1, wherein applying the external stimulus to the workpiece comprises or consists of applying an ultrasonic wave to the workpiece and/or applying pressure to the workpiece and/or applying a mechanical force to the workpiece and/or heating the workpiece and/or cooling the workpiece and/or applying a vacuum to the workpiece.

12. A system for producing a substrate with a functional layer, the system comprising:
- a support member for supporting a workpiece, the workpiece having a first surface and a second surface opposite the first surface;
- a modified layer forming means configured to form a modified layer inside the workpiece, the modified layer comprising a plurality of modified regions;
- a functional layer forming means configured to form the functional layer on the first surface of the workpiece, after forming the modified layer inside the workpiece; and
- a dividing means configured to divide the workpiece along the modified layer, thereby obtaining the substrate with the functional layer, after forming the functional layer on the first surface of the workpiece, wherein the dividing means comprises an external stimulus applying means configured to apply an external stimulus to the workpiece.

\* \* \* \* \*